United States Patent [19]
Loose

[11] 4,363,529
[45] Dec. 14, 1982

[54] TERMINAL HAVING IMPROVED MOUNTING MEANS

[75] Inventor: Winfield W. Loose, Linglestown, Pa.

[73] Assignee: AMP Incorporated, Harrisburg, Pa.

[21] Appl. No.: 172,109

[22] Filed: Jul. 25, 1980

[51] Int. Cl.³ .............................................. H05K 1/00
[52] U.S. Cl. ............................... 339/17 C; 339/221 R
[58] Field of Search .............. 339/17 M, 17 C, 258 R, 339/17 R, 220 R, 221 R

[56] References Cited

U.S. PATENT DOCUMENTS

| | | | |
|---|---|---|---|
| 3,718,895 | 2/1971 | Reynolds | 339/258 R |
| 3,764,955 | 10/1973 | Ward | 339/65 |
| 3,820,055 | 6/1974 | Huffnagle | 339/17 F |
| 3,845,455 | 10/1974 | Shoemaker | 339/103 C |
| 4,260,216 | 4/1981 | Ackerman | 339/220 R X |
| 4,261,629 | 4/1981 | Reynolds et al. | 339/17 C |

OTHER PUBLICATIONS

AMP Engineering & Purchasing Guide.

*Primary Examiner*—John McQuade
*Assistant Examiner*—Frank H. McKenzie, Jr.
*Attorney, Agent, or Firm*—Frederick W. Raring

[57] ABSTRACT

Stamped and formed sheet metal terminal device has improved mounting means for mounting terminal on a circuit board. Mounting means comprises first and second coextensive mounting legs extending from the terminal and having free ends which are remote from the terminal. The legs have retaining portions adjacent to the terminal and reduced width portions extending from the retaining portions to the free ends. Camming means are provided on the reduced width portions which cause the retaining portions to move apart during final stages of movement of the legs into the circuit board hole and thereby establish an interference fit of the legs in the circuit board hole.

12 Claims, 11 Drawing Figures

FIG. 7
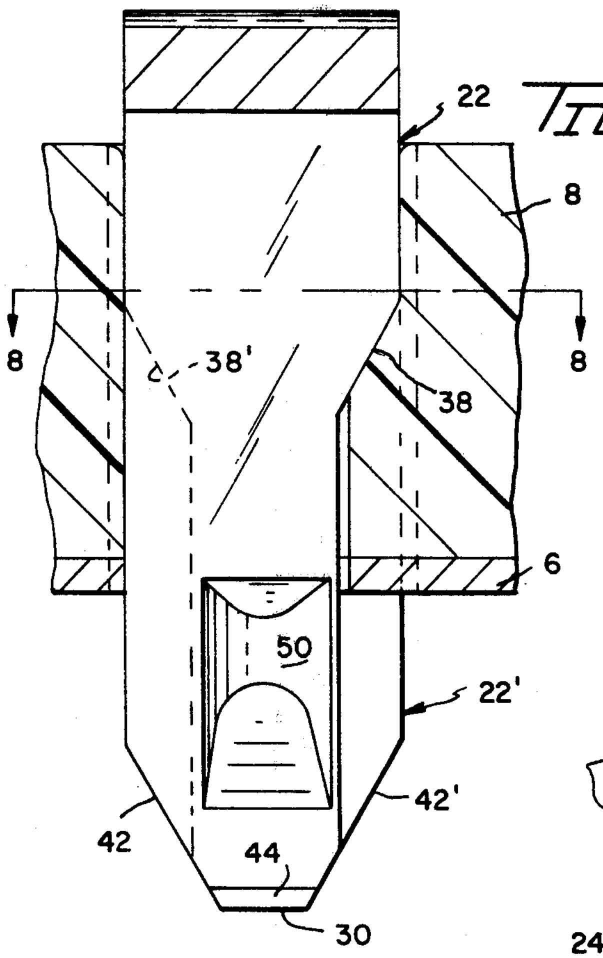
FIG. 9
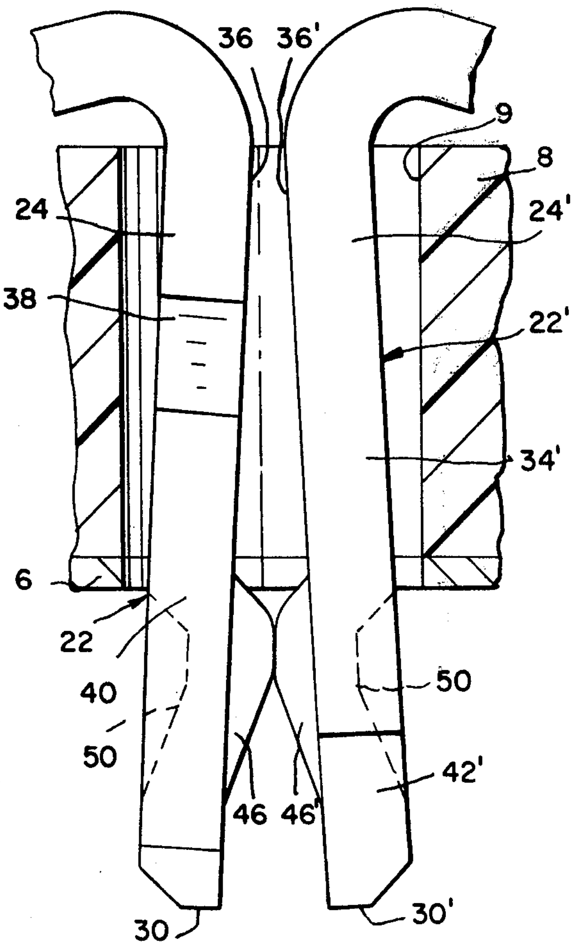
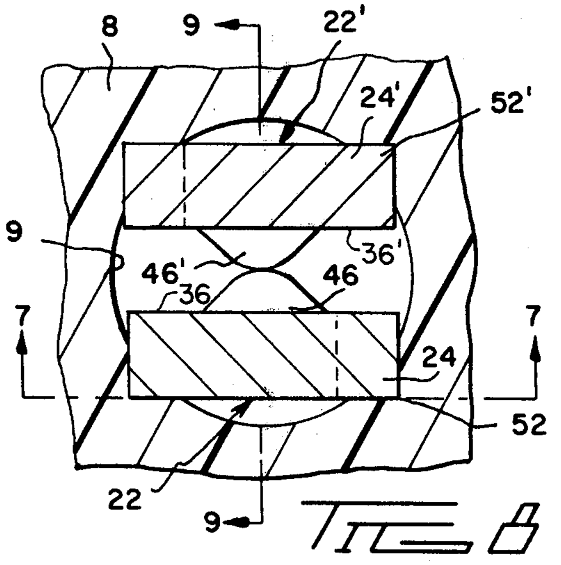
FIG. 8

TERMINAL HAVING IMPROVED MOUNTING MEANS

FIELD OF THE INVENTION

This invention relates to stamped and formed terminals of the type intended to be mounted in holes on circuit boards and particularly to improved mounting legs for such terminals. The invention is disclosed on a terminal of the type fully disclosed and claimed in U.S. patent application Ser. No. 113,946 filed Jan. 21, 1980, however, the invention can be used on a wide variety of stamped and formed electrical terminals.

BACKGROUND OF THE INVENTION

It is common manufacturing practice in the electrical industry to mount terminals on circuit boards by means of mounting legs which are dimensioned to be received in circular holes in the circuit board. The mounting legs are usually, but not always, soldered to conductors on the circuit board after insertion. In the manufacture of circuit boards having terminals thereon, the terminals may be inserted by machinery or manually at one work station and are usually handled and transported at a later time to other work stations for subsequent operations such as soldering of the terminals to the circuit board conductors. It is important, therefore, that the mounting legs be capable of holding the terminals on the circuit board prior to soldering with sufficient security to prevent their being removed prior to the soldering operation and during all handling subsequent to insertion.

The mounting legs for terminals, in accordance with present practice, may be dimensioned to have an interference fit in the circuit board hole or they may be designed to provide a resilient force on the walls of the circuit board hole after they are inserted. Prior art terminals having mounting legs of these general types are acceptable if the dimensions of the mounting legs and the diameters of the circuit board holes are such that the terminals are retained in the holes. However, if the circuit board holes are oversized relative to the dimensions of the mounting legs on the terminals, frequent problems are encountered in that the terminals tend to fall from the mounting holes. Manufacturers of electrical equipment are frequently troubled by such problems for the reason that they usually obtain their circuit boards from a remote source and they have limited control over the manufacture of the circuit boards. A manufacturer of electrical equipment must, therefore, frequently solve problems involving oversize circuit board holes and resulting insecurely placed terminals on a circuit board by the use of added manpower and reworking and inspection of the circuit boards immediately prior to soldering.

It would be desirable to improve presently available mounting legs for terminals in a way which would permit the use of the mounting legs in circuit board holes of varying diameters beyond the variations in hole diameters which are acceptable for presently available mounting means on terminals and thereby avoid problems as discussed above, which are presently being encountered. The present invention is directed to the achievement of improved mounting legs for terminals which can be used in circuit board holes having a range of hole diameters.

BRIEF DESCRIPTION OF THE INVENTION

A terminal in accordance with the present invention has first and second side-by-side coextending mounting legs extending therefrom. The mounting legs have free ends which are remote from the terminal and have opposed flat surfaces located on opposite sides of a central axis. The two mounting legs are normally aligned with each other, but are resiliently flexible laterally of their lengths between aligned and nonaligned positions. The mounting legs have retaining portions which extend from a location adjacent to the terminal partially along the lengths of the legs and have reduced width portions extending from the retaining portions to the free ends. The width of the retaining portions is substantially equal to, and slightly less than, the diameter of the smallest circuit board hole for which the terminal device is intended. The reduced width portions of the legs have camming means which are cooperable with portions of the circuit board hole during movement of the legs into the circuit board hole to cause movement of the legs away from each other. When the terminal is fully inserted into a circuit board hole, the retaining portions extend as chords across the hole on opposite sides of the axis of the circuit board hole. These retaining portions are moved away from each other by an amount such that they penetrate the walls of the circuit board hole and establish an interference fit which securely retains the terminal on the circuit board.

DESCRIPTION OF THE DRAWINGS

FIGS. 3–9 are a series of views illustrating the movement of mounting legs in accordance with the invention into a circuit board hole of a minimum diameter.

FIG. 3 shows the legs in alignment with the circuit board hole prior to insertion.

FIG. 4 is a cross-sectional view taken along the lines 4—4 of FIG. 3.

FIG. 5 is a view similar to FIG. 3 showing the legs partially inserted into the circuit board hole, this view being taken along the lines 5—5 of FIG. 6.

FIG. 6 is a view taken along the lines 6—6 of FIG. 5.

FIG. 7 is a view showing the legs in their fully inserted position, and

FIG. 8 is a view taken along the lines 8—8 of FIG. 7.

FIG. 9 is a view taken along the lines 9—9 of FIG. 8.

DISCLOSED EMBODIMENT OF THE INVENTION

Figure 1:
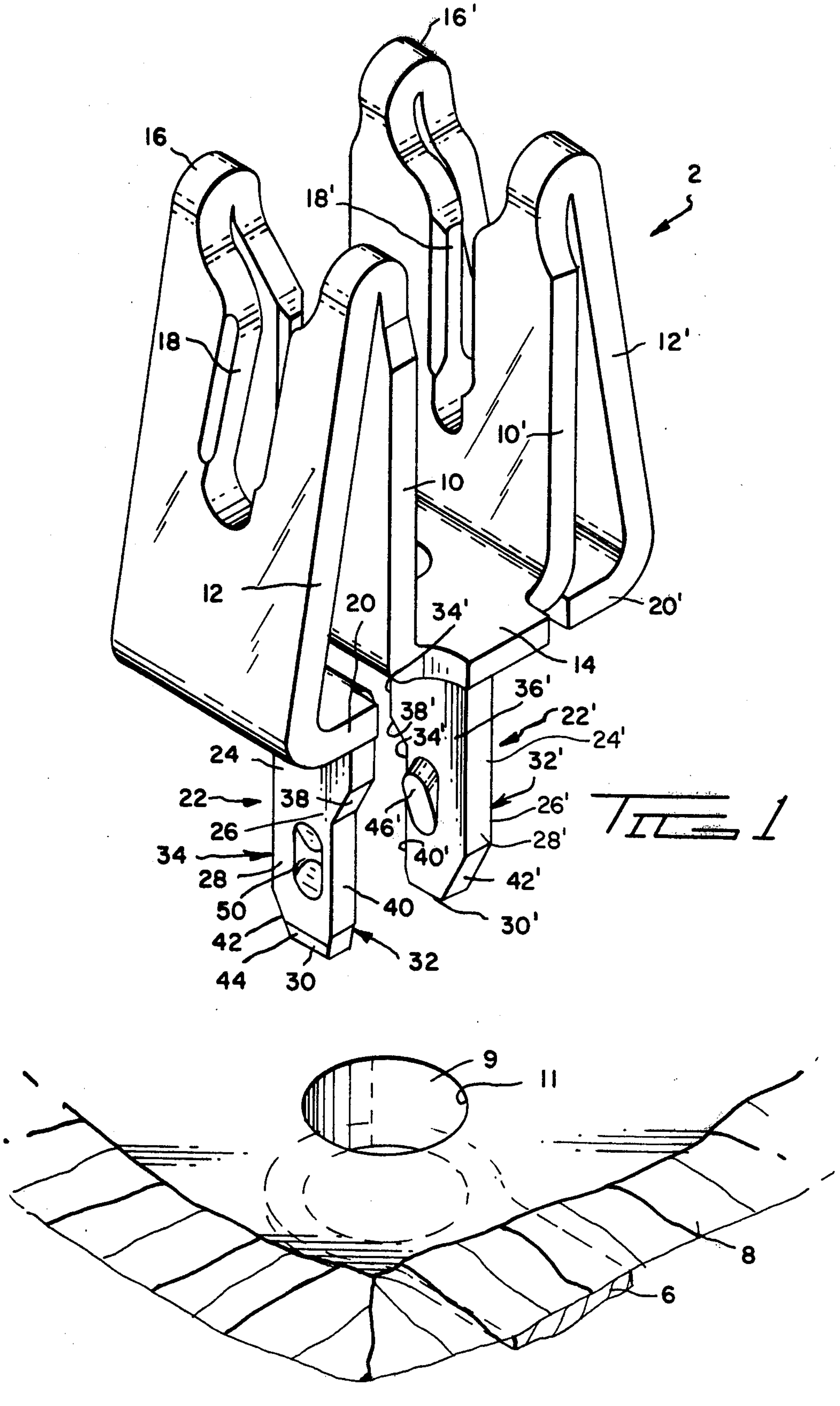
FIG. 1 is a perspective view of a terminal having mounting legs in accordance with the invention, the terminal being shown as exploded from a circuit board and in alignment with a hole in the circuit board.
Figure 2:
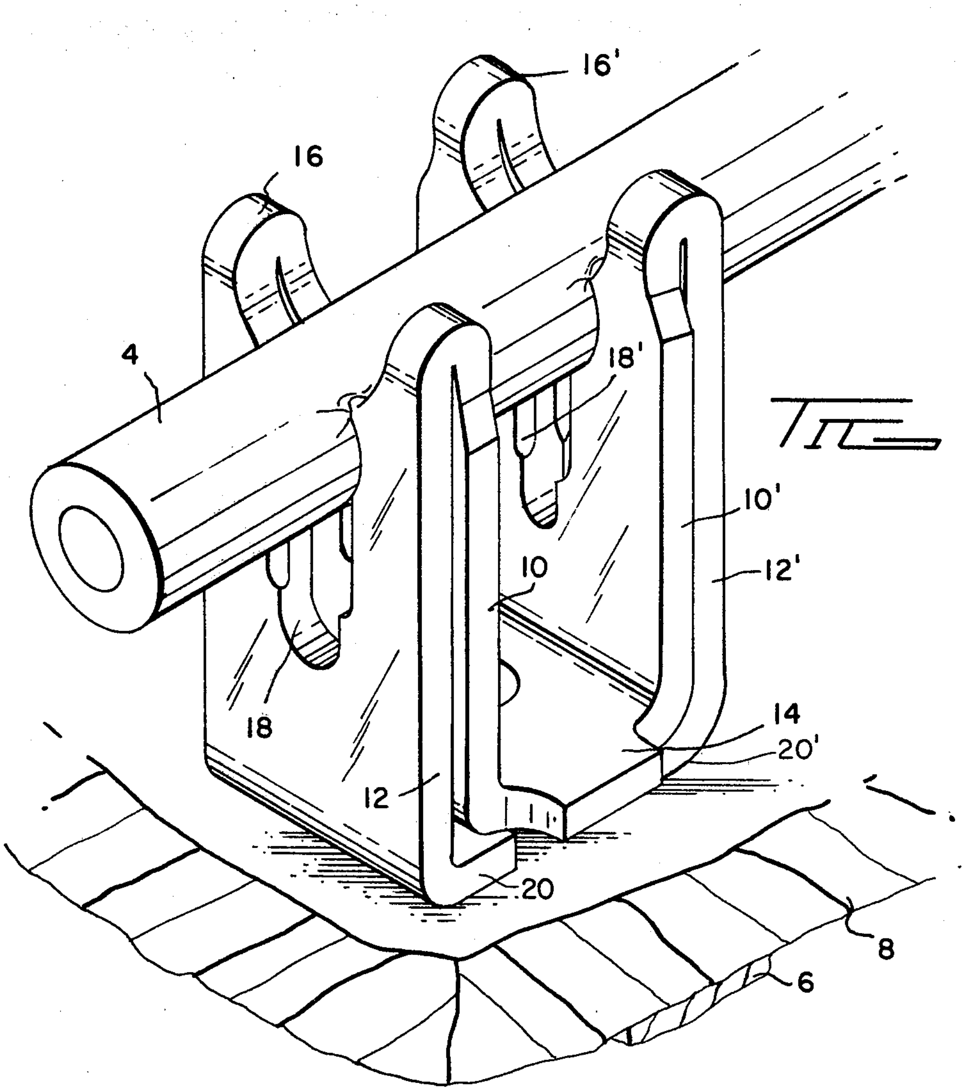
FIG. 2 is a view similar to FIG. 1 showing the terminal mounted on a circuit board.

FIG. 1 shows a stamped and formed contact terminal 2 having mounting means on its lower end for mounting the terminal on the circuit board such that the terminal can be soldered to conductors 6 on the underside of the circuit board 8. The terminal 2 is of the type disclosed and claimed in the above identified U.S. application Ser. No. 113,946.

The terminal 2 comprises opposed inner platelike members 10, 10′ and outer platelike members 12, 12′ which are connected to the inner platelike members by reverse bends 16, 16′. The inner platelike members 10, 10′ are connected to each other by an integral bight 14 and the outer platelike members 12, 12′ are inwardly turned at their lower ends as shown at 20, 20′. The mounting means comprises first and second mounting legs 22, 22′ which extend downwardly from the inwardly turned portions 20, 20′. When the terminal is to be mounted on the circuit board 8, the legs 22, 22′ are moved relatively towards each other and are then inserted into the circuit board hole 9. After soldering of the lower ends of the legs to the conductors 6, a wire 4 can be moved into the slots 18, 18′ of the platelike members 10, 12, and 10′, 12′ so that the edges of these slots will penetrate the insulation of the wire and contact the conducting core of the wire.

The legs 22, 22′ are similar but are not identical to each other and the same reference numerals differentiated by prime marks are therefore used to identify corresponding structural features of the two legs.

Each leg has a retaining portion 24, 24′ which is adjacent to the portions 20, 20′, a cam actuator portion 26, 26′ which adjoins the retaining portions 24, 24′ and camming end guiding portions 28, 28′ which extend to the free ends 30, 30′ of the legs. The legs have opposed surfaces 36, 36′ and first and second side edges on each side of the opposed surfaces. The side edges of the first leg 22 are indicated at 32 and 34 and the first and second side edges of the second leg 22′ being indicated at 32′ and 34′.

The legs are of the same width as measured between the side edges in the retaining portions 24, this width being substantially equal to, and slightly less than, the diameter of the smallest hole for which the device is intended. For example, the retaining portions 24, 24′ should have a width of about 0.101±0.05 mm when the smallest hole 9 for which the device is intended, has a diameter of about 1.07 mm. If the retaining portions have a width of 1.02 mm, the device can be mounted in circuit board holes in the range of about 1.07 mm to 1.27 mm.

Figure 4:
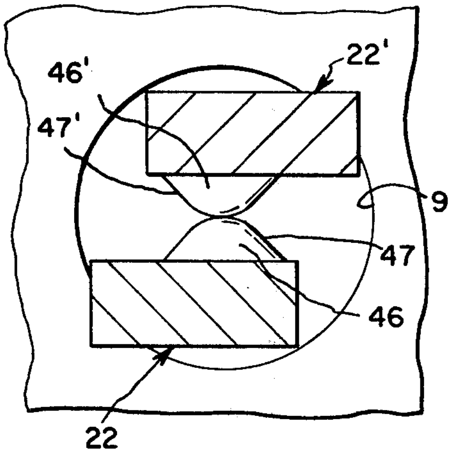

The cam actuator sections 26, 26′ and the camming and guiding portions 28, 28′ of the legs are of a reduced width relative to the retaining portions 24, 24′. As shown best in FIG. 1, the first side edge 32 of the first leg 22 is inclined, as shown at 38, inwardly beginning at the lower end of the retaining portion and the first side edge of the first leg 22 is inwardly displaced as shown at 40 in the camming and guiding portion relative to the first side edge 32′ of the leg 22′. The second side edge 34′ of the second leg 22′ slopes inwardly as shown at 38′ and in the camming and guiding portion, this second side edge of leg 22′ is inwardly displaced as shown at 40′ relative to the second side edge 34 of the first leg 22. The width of the legs in the camming and guiding sections 28, 28′ should be such that the legs will move freely into the smallest diameter hole for which the device is intended. For example, this width may be 0.76 mm when the terminal is intended for circuit board holes having diameters in the range of 1.07 to 1.27 mm. The opposed surfaces of the legs have camming bosses 46, 46′ thereon, located in the camming and guiding portions 28, 28′. These camming bosses have camming surfaces 47, 47′ which are approximately parabolic, as shown in FIG. 4, and are opposed to each other when the legs are in their normal positions so that when the legs are moved towards each other these surfaces will engage each other. These bosses are formed by indenting the outwardly facing surfaces of the legs 22, 22′, as shown in FIG. 1 at 50.

Adjacent to the free end 30 of the leg 22, the second side edge 34 is sharply inclined inwardly as shown at 42 to provide a lead-in surface for the terminal when it is inserted into the hole 9. The lower portion of the first side edge 32′ of the second leg 22′ is similarly inclined inwardly as shown at 42′. The free ends of the legs 30, 30′ can also be swaged, as shown at 44, to further facilitate movement of the free ends into the circuit board hole.

Figure 3:
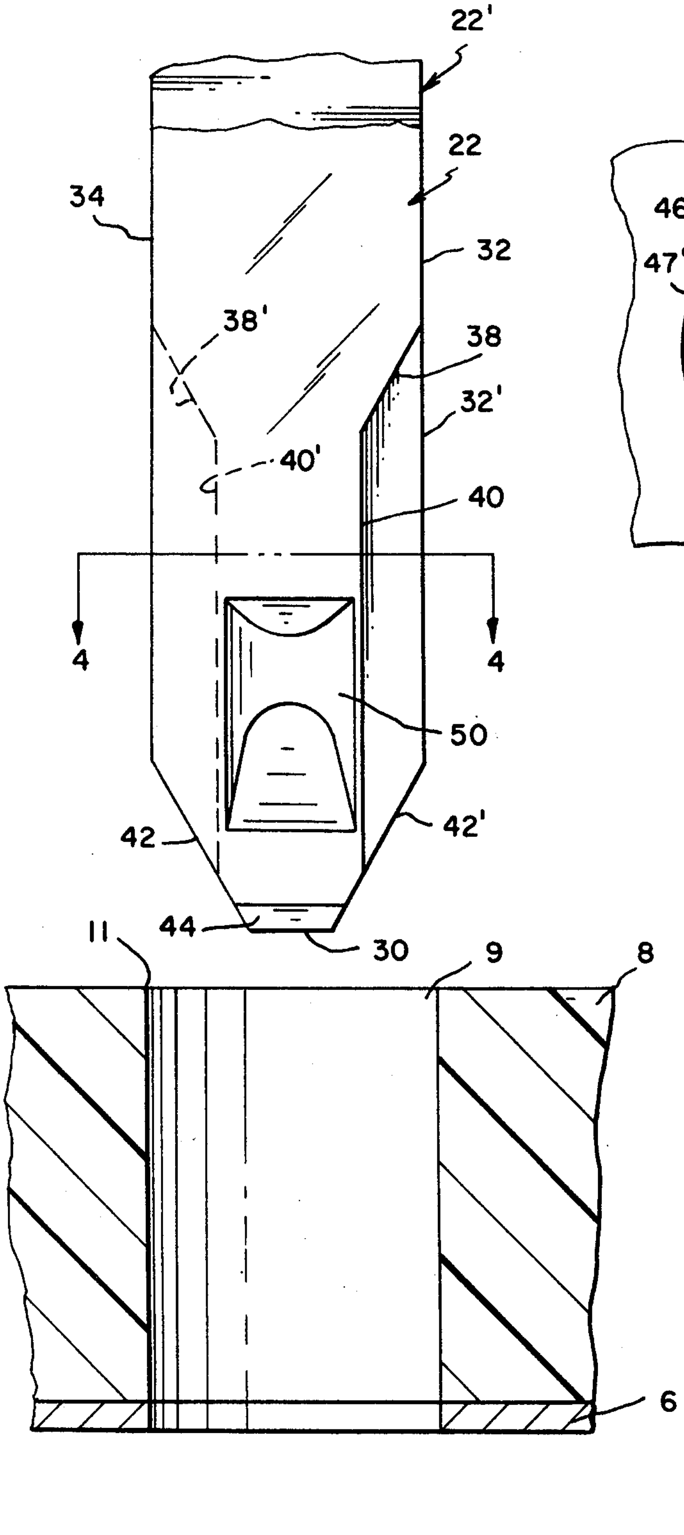

The legs 22, 22′ are normally opposed to each other as shown in FIGS. 3 and 4, and their camming and guiding portions 28, 28′ overlap so that the total width of both legs is the same as the width of an individual leg 22, 22′ in the retaining portions 24, 24′. The legs are, however, capable of limited flexing laterally in their own planes, for reasons which will be explained below and as illustrated in FIG. 5.

Figure 5:
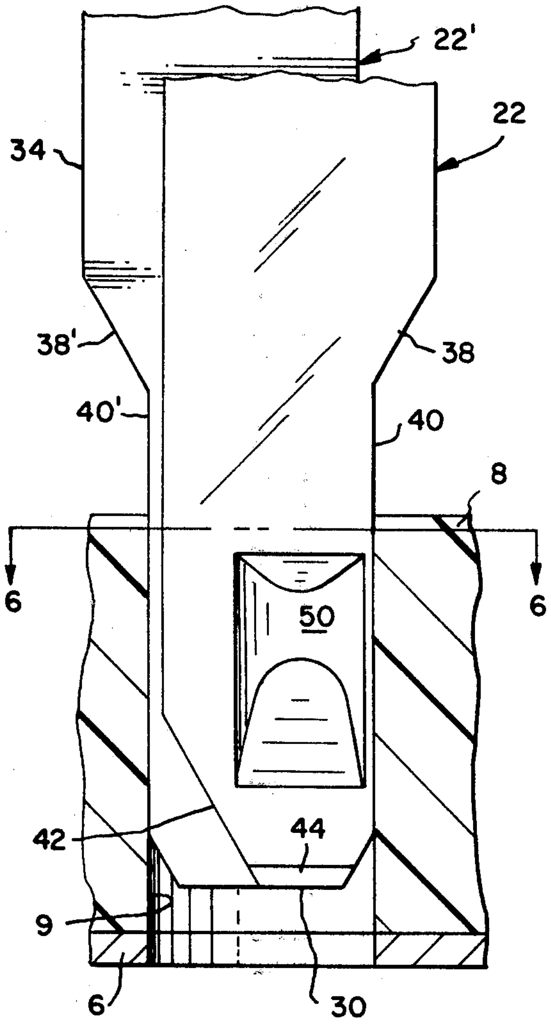
Figure 6:
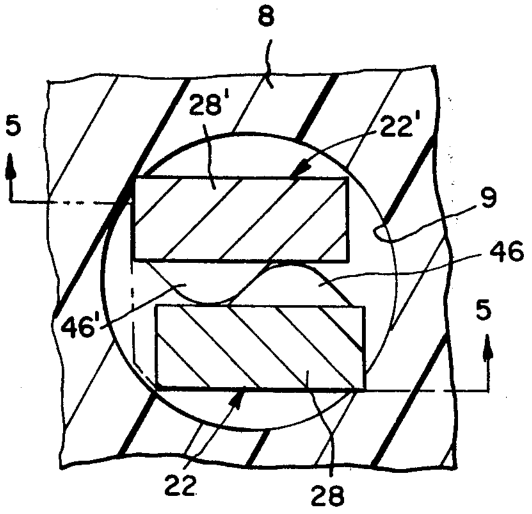

When the terminal 2 is to be inserted into a circuit board 8, the outer platelike members 12, 12′ are flexed inwardly towards the inner platelike members 10, 10′ until the surfaces 47, 47′ of the cams 46, 46′ are against each other, as shown in FIG. 5. The operation of flexing the terminal in this manner and inserting it into the circuit board hole can be carried out either manually or by an insertion machine.

After the legs have been brought against each other, they are aligned with the circuit board hole 9 and moved downwardly from the position of FIG. 3 to the position of FIG. 4. During this downward motion, the inclined lower portions 42, 42′ of the second side edge 34 of the first leg and the first side edge 32′ of the second leg 22′ will engage the edge 11 of the circuit board hole and the legs will be flexed slightly so that their camming and guiding portions 28, 28′ coincide, as shown in FIG. 5. This flexure of the legs causes their camming and guiding portions to move in opposite directions parallel to their own planes so that the camming surfaces 47, 47′ move across each other until the cams 46, 46′ are side-by-side.

Upon further movement of the legs into the circuit board hole, the inclined portions 38, 38′ of the first and second legs engage the edge 11 of the circuit board hole thereby causing the legs to be moved back towards their aligned positions. When this movement is completed, the cams 46, 46′ will again be brought into opposed aligned positions and the legs will thereby be cammed apart. As the result, the retaining portions 24, 24′ penetrate the circuit board and establish a secure interference fit of these retaining portions in the circuit board hole. The cams 46, 46′ serve as a locking means after complete insertion of the terminal and maintain this interference fit in the circuit board hole.

FIGS. 3–8 illustrate the movement of the legs into a circuit board hole 9 at the lower tolerance limit of the range of circuit board holes for which the legs are intended. Under these circumstances it will be seen from FIG. 8, that the corners 52, 52′ of the legs penetrate the material of the circuit board relatively deeply. The condition shown in FIG. 8 has been observed and this condition will come about if the circuit board is of relatively soft material, for example, if the circuit board is of a paper filled phenolic resin. If the circuit board is of a relatively hard material which is resistant to penetration by the corners 52, 52', the legs may not be fully returned to their aligned positions and may be flexed along their axes to some extent. In this latter event, however, a tight interference fit of the legs in the circuit board hole is nonetheless obtained.

Figure 10:
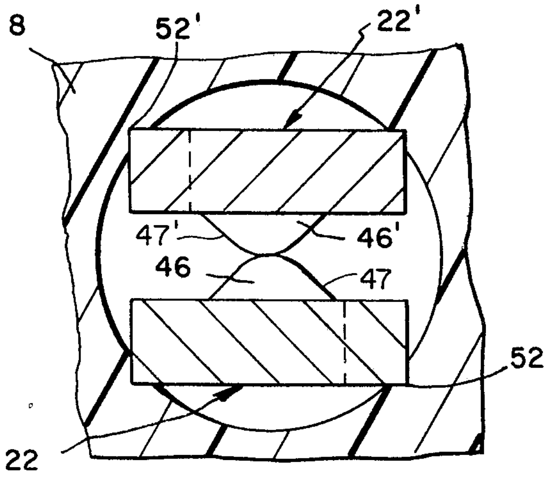
FIG. 10 is a view similar to FIG. 8 showing the manner in which the legs are retained in a relatively large diameter circuit board hole.

FIG. 10 is similar to FIG. 8 except that it shows the condition which exists when the legs are inserted into a hole at the upper tolerance limit of the range of hole diameters. The corners 52, 52' do not penetrate the material of the circuit board to the same extent, however, they are wedged tightly in the hole and are maintained in their wedged condition by the cams 46, 46'.

Figure 11:
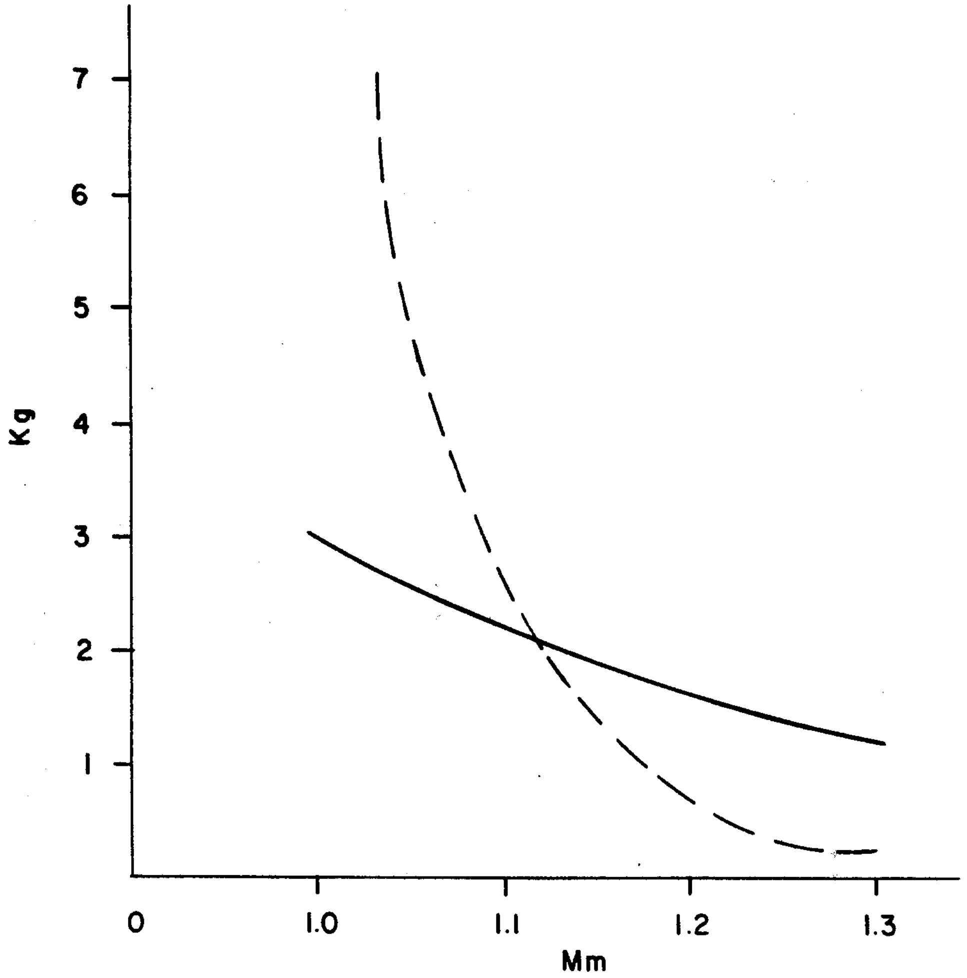
FIG. 11 is a graphical representation of the retention force of a retaining means in accordance with the invention, as compared with one known-retaining means for terminals.

FIG. 11 illustrates the advantage obtained in the practice of the invention, as compared with prior art methods of mounting terminals in circuit boards. The dotted line curve in FIG. 11 relates the pushout force, the force required to push a terminal out of a circuit board hole after insertion, to the diameter of the circuit board hole. These data for the dotted line curve were obtained from tests in which the terminal had two legs designed to provide a simple interference fit. It can be seen from this dotted line curve that the pushout force drops abruptly within a very narrow band of hole diameters to an unacceptably low level when the hole diameter reaches 1.27 mm. The solid line curve, by way of comparison, shows that the pushout force drops only very slightly when the hole diameter changes from 1.07 mm to 1.27 mm and satisfactory results are obtained even if the hole is a diameter greater than 1.27 mm.

I claim:

1. A stamped and formed sheet metal terminal device of the type intended for mounting in a circular hole in a panel-like member such as a circuit board, said device having improved mounting leg means intended for reception in said circuit board hole, said mounting leg means being characterized in that:

said mounting leg means comprises first and second side-by-side coextensive mounting legs extending from said terminal device and having free ends which are remote from said terminal device, said legs having retaining portions which extend from said device partially along the lengths of said legs, said retaining portions having a width which is sufficient to establish an interference fit in the smallest circuit board hole for which said device is intended, said legs having reduced width portions between said retaining portions and said free ends and extending to said free ends, camming means on said reduced width portions, said camming means being cooperable with portions of said circuit board hole to cause movement of said legs away from each other during movement of said legs into said circuit board hole whereby, said legs can be readily inserted into said circuit board hole by virtue of said reduced width portions, and during movement of said legs into said circuit board hole, said legs will be moved away from each other by said camming means and said retaining portions will establish an interference fit in said circuit board hole and retain said device on said circuit board.

2. A terminal device as set forth in claim 1, said legs having opposed major surfaces and each leg having first and second side edges on each side of said major surfaces.

3. A terminal device as set forth in claim 2, said legs being substantially flat, said retaining portions of said legs having a width which is substantially equal to, and less than, the diameter of the smallest circuit board hole for which said device is intended.

4. A device as set forth in claim 3, said camming means comprising camming bosses on said opposed surfaces proximate to said free ends.

5. A device as set forth in claim 3, said camming means comprising normally opposed camming bosses on said opposed surfaces proximate to said free ends, and cam actuator means between said retaining portions and said camming bosses, said cam actuator means being cooperable with edge portions of said circuit board hole to cause said camming bosses to move said retaining portions away from each other.

6. A device as set forth in claim 5, said cam actuator means comprising said side edges of said legs.

7. A stamped and formed sheet metal terminal device of the type intended for mounting in a circular hole in a panel-like member such as a circuit board, said device having improved mounting leg means intended for reception in said circuit board hole, said mounting leg means being characterized in that:

said mounting leg means comprises first and second side-by-side coextensive mounting legs extending from said terminal device and having free ends which are remote from said terminal device, said mounting legs having opposed major surfaces and each leg having first and second side edges which extend to said free ends on each side of said major surfaces, said mounting legs being normally in opposed aligned relationship and being resiliently flexible laterally of their lengths between aligned and non-aligned positions, said legs having retaining portions which extend from said device partially along the lengths of said legs, said retaining portions having a width, as measured between said side edges, which is substantially equal to, and less than, the diameter of the smallest hole for which said terminal device is intended, said legs having camming and guiding portions which extend from a location proximate to said free ends to said free ends, said first side edge of said first leg and said second side edge of said second leg being inwardly displaced in said camming and guiding portions relative to first said side edge of said second leg and said second side edge of said first leg respectively, said legs having cam actuator portions between said retaining portions sand said camming and guiding portions, said first side edge of said first leg extending diagonally in said cam actuator portion from said camming and guiding portion to said retaining portion, said second side edge of said second leg extending diagonally in said cam actuator portions from said camming and guiding portion to said retaining portion, and said opposed major surfaces of said legs having camming means thereon in said camming and guiding portions, said camming means being effective to cam said legs apart so that said major surfaces move away from each other normally of their own planes when said legs are moved laterally from said nonaligned position to said aligned position whereby, upon insertion of said legs into said circuit board hole, said legs will move from said aligned position to said non-aligned position as said camming and guiding portions enter said hole, and upon passage of said cam actuator portions into said hole, said legs will be moved by engagement of said first and second side edges of said cam actuator portions with edge portions of said hole towards said aligned positions with accompanying movement of said legs away from each other under the influence of said camming means, and said mounting portions will thereafter move into said hole and establish an interference fit in said hole to retain said terminal device on said circuit board.

8. A terminal device as set forth in claim 7, said first and second legs being normally spaced apart, said legs being movable relatively towards each other for insertion into said circuit board hole.

9. A stamped and formed sheet metal terminal device as set forth in either of claims 7 or 8, portions of said first side edge of said leg adjacent to said free end of said first leg and portions of said second side edge of said second leg adjacant to said free end being tapered towards said free ends of said legs thereby to provide guiding portions on said free ends of said legs.

10. A stamped and formed sheet metal terminal device as set forth in claim 9, said terminal device comprising an elongated strip of sheet metal having intermediate portions thereof formed to provide a contact portion, said legs constituting the ends of said strip.

11. A stamped and formed sheet metal terminal device mounted on a circuit board by means of improved mounting leg means extending from said terminal device into a circuit board hole, said improved mounting leg means comprising:

first and second mounting legs extending from said terminal device through said circuit board hole, each of said legs having a retaining portion and a free end, said retaining portions being proximate to said terminal device and being spaced from said free end, said retaining portions comprising spaced-apart members extending as chords on opposite side of the axis of said circuit board hole, said retaining members bearing against wall portions of said circuit board hole thereby providing an interference fit of said retaining portions in said circuit board hole, locking means on said legs proximate to said free ends, said locking means preventing movement of said legs towards each other and thereby maintaining said interference fit of said retaining portions in said circuit board hole.

12. A terminal device mounted on a circuit board as set forth in claim 11, said locking means comprising opposed bosses on said legs, said bosses being against each other.

* * * * *